United States Patent
Sasaki et al.

(10) Patent No.: US 10,438,912 B2
(45) Date of Patent: Oct. 8, 2019

(54) LIQUID EJECTION HEAD SUBSTRATE AND SEMICONDUCTOR SUBSTRATE

(71) Applicant: CANON KABUSHIKI KAISHA, Tokyo (JP)

(72) Inventors: Koji Sasaki, Nagareyama (JP); Shingo Nagata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/912,858

(22) Filed: Mar. 6, 2018

(65) Prior Publication Data
US 2018/0277503 A1    Sep. 27, 2018

(30) Foreign Application Priority Data

Mar. 21, 2017    (JP) .................. 2017-054760

(51) Int. Cl.
*H01L 23/00*    (2006.01)
*B41J 2/16*    (2006.01)
*B41J 2/14*    (2006.01)

(52) U.S. Cl.
CPC .......... *H01L 24/05* (2013.01); *B41J 2/1433* (2013.01); *B41J 2/14072* (2013.01); *B41J 2/162* (2013.01); *B41J 2/1603* (2013.01); *B41J 2/1623* (2013.01); *B41J 2/1629* (2013.01); *B41J 2/1631* (2013.01); *B41J 2/1643* (2013.01); *B41J 2/1645* (2013.01); *H01L 24/03* (2013.01); *H01L 2224/0362* (2013.01); *H01L 2224/03462* (2013.01); *H01L 2224/03614* (2013.01); *H01L 2224/04042* (2013.01); *H01L 2224/05082* (2013.01); *H01L 2224/05092* (2013.01); *H01L 2224/05144* (2013.01); *H01L 2224/05166* (2013.01); *H01L 2224/05181* (2013.01); *H01L 2224/05184* (2013.01); *H01L 2924/04941* (2013.01); *H01L 2924/04953* (2013.01)

(58) Field of Classification Search
CPC .... B41J 2/14072; B41J 2/1433; B41J 2/1603; B41J 2/162; B41J 2/1623; B41J 2/1629; B41J 2/1631; H01L 24/05
See application file for complete search history.

(56) References Cited

FOREIGN PATENT DOCUMENTS

JP    11-334076 A    12/1999

*Primary Examiner* — Lamson D Nguyen
(74) *Attorney, Agent, or Firm* — Venable LLP

(57) ABSTRACT

A liquid ejection head substrate includes an electrode pad for receiving driving power for liquid ejection from an outside, the electrode pad including at least a conductor layer and a layer of gold. A portion of the conductor layer has an opening region, and an upper layer portion in a laminating direction above the conductor layer including the opening region has at least the layer of gold. An external connection portion connected to the outside is provided on top of the layer of gold corresponding to the opening region of the conductor layer.

13 Claims, 5 Drawing Sheets

LIQUID EJECTION HEAD SUBSTRATE AND SEMICONDUCTOR SUBSTRATE

BACKGROUND OF THE INVENTION

Field of the Invention

The present invention relates to a liquid ejection head substrate and a semiconductor substrate.

Description of the Related Art

A method for manufacturing an ink jet print head is known, in which an electrode pad is formed on an element substrate by using electrolytic plating (see Japanese Patent Laid-Open No. H11-334076(1999)).

In forming a gold bump on an electrode pad by using electrolytic plating, the following steps are performed in sequence: the step of forming a base layer with a metal material having a high melting point such as titanium tungsten (TiW), the step of forming a gold (Au) (base seed metal) film, the step of applying/exposing/developing a resist, the step of depositing gold by electrolytic plating, the step of stripping a resist, the step of etching the base seed metal, and the step of etching the base layer of a metal material having a high melting point.

In the case of forming a gold bump on a substrate, it is sometimes preferable that a gold film of the gold bump be thin. Specifically, in terms of cost reduction, it is desirable to have a thinner gold film. Furthermore, in laminating organic materials of ink jet nozzle material on a substrate having a thick gold bump formed thereon by a so-called photolithography process, for example, a thick convex portion on the substrate causes decrease in uniformity within the substrate surface. For this reason, there is a need for thinning a gold film.

However, in the case of a thin gold film, the problem is that heat or pressure applied on the gold bump in bonding an external connection portion to the gold bump may cause the gold to be diffused into the side of a conductor layer. If the gold is diffused into the side of the conductor layer, alloying may cause the bump to be less conductive or easily melted, resulting in lower reliability of the bump. To avoid this, bonding conditions may be changed to prevent the gold from being diffused into the side of the conductor layer by lowering heat and pressure. However, change in the bonding conditions may decrease adhesion of the external connection portion to the gold bump.

SUMMARY OF THE INVENTION

A liquid ejection head substrate according to one aspect of the present invention includes an electrode pad for receiving driving power for liquid ejection from an outside, the electrode pad including at least a conductor layer and a layer of gold, wherein a portion of the conductor layer has an opening region, an upper layer portion in a laminating direction above the conductor layer including the opening region has at least the layer of gold, and an external connection portion connected to the outside is provided on top of the layer of gold corresponding to the opening region of the conductor layer.

Further features of the present invention will become apparent from the following description of exemplary embodiments with reference to the attached drawings.

DESCRIPTION OF THE EMBODIMENTS

Figure 1A:
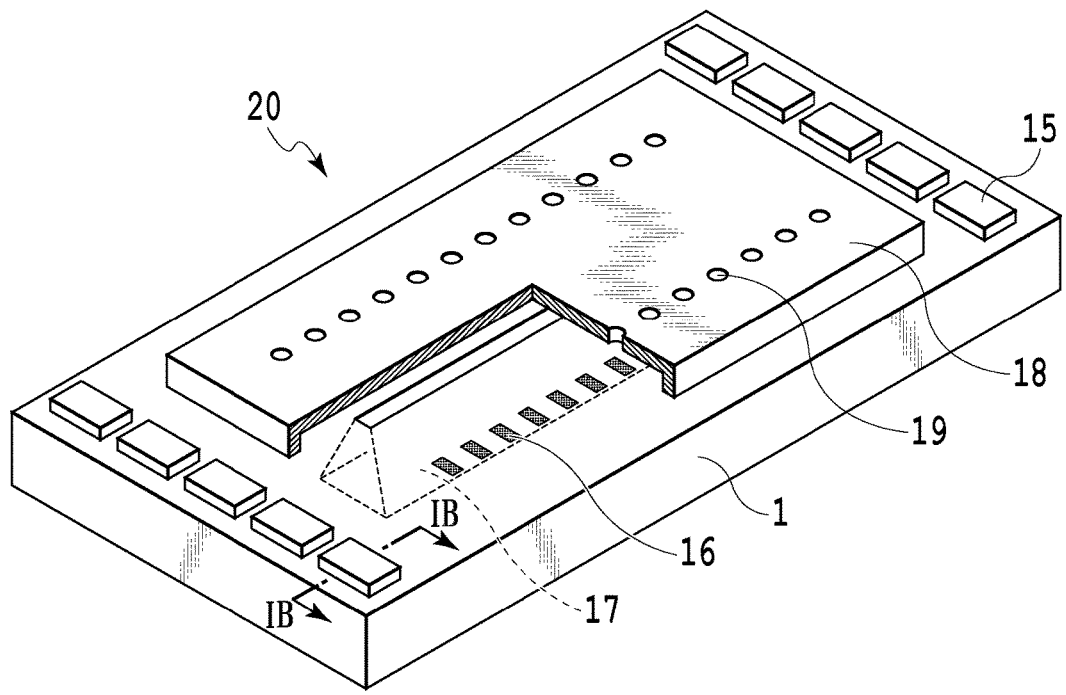
FIGS. 1A and 1B are views of a substrate for an ink jet print head.

Embodiments of the present invention will be described with reference to the drawings. It should be noted that the following embodiments do not limit the present invention and that not all of the combinations of the characteristics described in the present embodiments are essential for solving the problem to be solved by the present invention. Incidentally, the same reference numeral refers to the same component in the following description. Furthermore, relative positions, shapes, and the like of the components described in the embodiments are exemplary only and are not intended to limit the scope of the invention.

<First Embodiment>

Figure 1B:
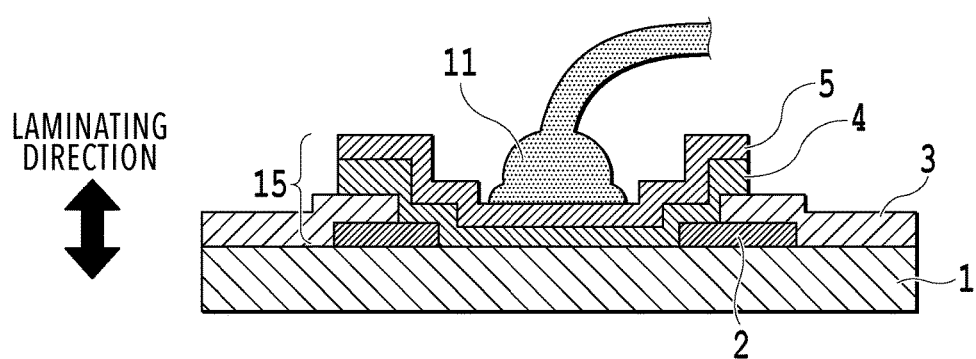

FIGS. 1A and 1B are views showing an ink jet print head substrate 20 which is an exemplary substrate for a liquid ejection head according to the present embodiment. FIG. 1A shows an exemplary perspective view of the ink jet print head substrate 20. FIG. 1B is a view showing a cross section taken along line IB-IB of FIG. 1A.

As shown in FIG. 1A, a semiconductor substrate 1 of the ink jet print head substrate 20 is provided with an ink supply port 17. On the semiconductor substrate 1, a heating heater 16, a nozzle resin material 18, an ink ejection port 19, and a gold bump 15 that receives power from the outside are formed. The heating heater 16 is composed of an ejection energy generation element for ejecting liquid (ink). The gold bump 15 includes an electrode pad portion that receives driving power for liquid ejection from the outside. FIG. 1B is a cross-sectional view of the vicinity of the gold bump 15 in the cross section taken along line IB-IB of FIG. 1A.

In FIG. 1B, a conductor layer 2 is formed in a region forming an electrode pad portion on the semiconductor substrate 1. The conductor layer 2 is shaped such that a region to which an external connection portion 11 is bonded is open. On top of the semiconductor substrate 1 and of a portion of the conductor layer 2 in a laminating direction, a protective layer 3 that protects the conductor layer 2 is formed. Since the external connection portion 11 needs to be connected to the conductor layer 2 in the electrode pad portion, a portion of the protective layer 3 is removed to form a through hole. In the electrode pad portion, a bump base metal film 4 is formed as a barrier metal on a surface portion of the semiconductor substrate 1, conductor layer 2, and protective layer 3. On top of the bump base metal film 4 in the laminating direction, a gold 5 is formed. Further, wiring used for connection to the outside is bonded to top of the gold 5 in the laminating direction as the external connection portion 11. In this manner, an upper layer portion in the laminating direction above the conductor layer 2 including the opening region has at least a layer of the gold 5. In the example of FIG. 1B, the upper layer portion in the laminating direction above the conductor layer 2 including the opening region has the layers of the bump base metal film 4 and the gold 5. That is, in the example of FIG. 1B, the bump base metal film 4 is formed as the barrier metal between the layer of the conductor layer 2 and the layer of the gold 5. Furthermore, on top of the layer of gold corresponding to the opening region of the conductor layer 2 (namely, the upper layer portion in the laminating direction above the opening region of the conductor layer 2), the external connection portion 11 connected to the outside is bonded.

In the case of employing a configuration of a thick gold film (a thickness of about 5 μm, for example), heat and pressure are absorbed by a thick gold film in bonding the external connection portion 11, and therefore metal diffusion of gold into the side of the conductor layer 2 can be avoided. Accordingly, in the configuration of the thick gold film, the metal diffusion of gold into the side of the conductor layer 2 does not take place. However, in the case of employing a configuration of a gold film having a thickness of 1.0 μm or less, gold is diffused into the side of the conductor layer 2 in bonding the external connection portion 11.

In the ink jet print head substrate 20 of the present embodiment, an opening is provided on a portion of the conductor layer 2 (wiring layer) in the electrode pad portion, and the gold bump 15 made of a gold thin film (a thickness of 1 μm or less) is formed. Then, the external connection portion 11 is bonded to the opening portion. According to this configuration, the conductor layer 2 does not exist in a lower layer portion in the laminating direction below the external connection portion 11 on which heat and pressure have a large impact in bonding the external connection portion 11. This configuration allows reduction of the metal diffusion of gold into the side of the conductor layer 2 caused by the heat and pressure applied in bonding the external connection portion 11. Accordingly, it is possible to provide an ink jet print head substrate having a high connection reliability at low cost. Moreover, since the gold film is thin and the convex portion can be lowered, a nozzle made of a resin material can be processed with high precision after forming a gold bump. Note that since the bump base metal film 4 is formed as the barrier metal between the conductor layer 2 and the gold 5, the external connection portion 11 can be energized and the gold bump 15 can maintain its function as a bump even without the conductor layer 2 in the lower layer portion in the laminating direction below the external connection portion 11.

An opening area of the opening region is preferably greater than an area of the region having the external connection portion 11 bonded thereto. Furthermore, a center portion of the region having the external connection portion 11 bonded thereto is preferably not formed in the upper layer portion in the laminating direction above the conductor layer 2. In other words, the opening region of the conductor layer 2 is preferably formed in the lower layer portion in the laminating direction below the center portion of the region having the external connection portion 11. The purpose is to avoid metal diffusion of the gold 5 into the side of the conductor layer 2 caused by the heat and pressure applied in bonding the external connection portion 11.

FIGS. 2A to 2L illustrate a process for producing the ink jet print head substrate 20 which is an exemplary substrate for a liquid ejection head according to the present embodiment. With reference to FIGS. 2A to 2L, steps for producing a bump to be formed in an electrode pad portion 21 will be described. FIGS. 2A to 2L show that the steps advance from FIGS. 2A to 2L. The vertical direction in each figure is referred to as the laminating direction throughout FIGS. 2A to 2L.

Figure 2A:
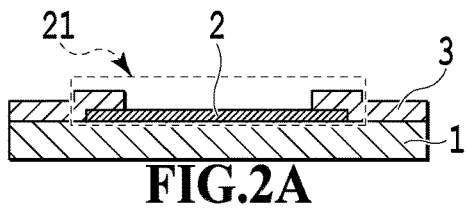
FIGS. 2A to 2L are schematic cross-sectional views showing steps for producing a bump.

FIG. 2A shows the electrode pad portion 21 in a stage before forming a bump. The conductor layer 2 is formed on the semiconductor substrate 1. On the semiconductor substrate 1, elements including the heating heater 16 (not shown in FIG. 2A) as shown in FIG. 1A are formed. The conductor layer 2 in the electrode pad portion 21 does not have an opening region, and the conductor layer 2 is formed across the electrode pad portion 21. The protective layer 3 is formed on the portion of the conductor layer 2 and on the semiconductor substrate 1.

Figure 2H:
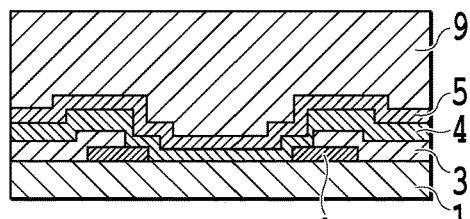
Figure 2B:
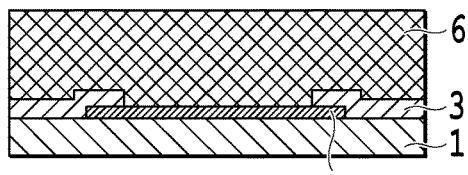

FIG. 2B shows a state in which a step of applying a first photoresist 6 onto the conductor layer 2 has been performed by spin coating or the like.

Figure 2C:
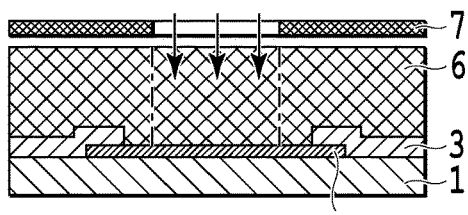

FIG. 2C shows a state in which a step of exposing a resist pattern using a first photomask 7 has been performed by a lithography technique. The first photomask 7 has a mask formed thereon, corresponding to the opening region to be formed on the conductor layer 2. Furthermore, the mask is formed such that the opening area of the opening region formed on the conductor layer 2 is smaller than an opening area of an opening region of the protective layer 3.

Figure 2I:
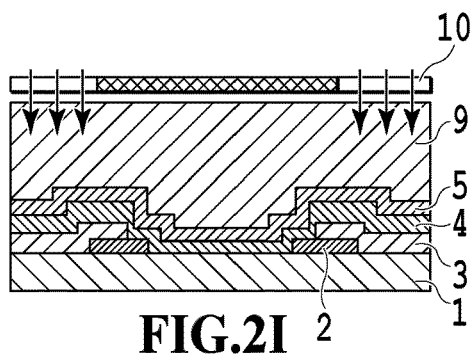
Figure 2D:
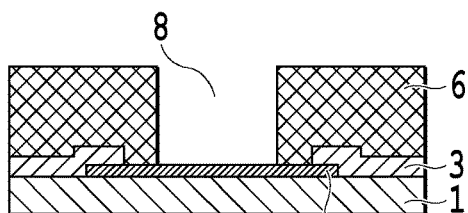

FIG. 2D shows a state in which a step of forming a pad opening portion 8 by developing the resist pattern as exposed in FIG. 2C has been performed. After the step of forming the pad opening portion 8, a portion of the conductor layer 2 is exposed.

Figure 2J:
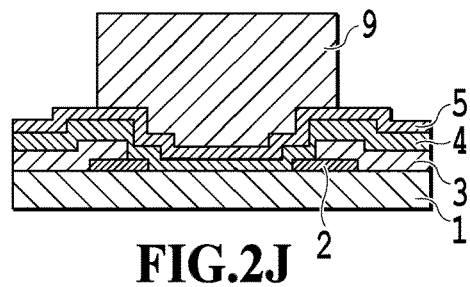
Figure 2E:
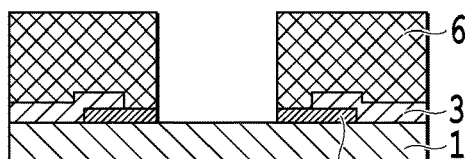

FIG. 2E shows a state in which a step of opening a portion of the conductor layer 2 has been performed. In FIG. 2E, by using wet etching, the exposed portion of the conductor layer 2 resulting from the forming of the pad opening portion 8 is removed, whereby a portion of the conductor layer 2 becomes open. It should be noted that dry etching may also be used to open a portion of the conductor layer 2.

Figure 2F:

FIG. 2F shows a state in which a step of immersing the semiconductor substrate 1 in a stripping agent for the first photoresist 6 for a predetermined time to remove the first photoresist 6 has been performed. By removing the first photoresist 6, the conductor layer 2 is exposed.

Figure 2K:
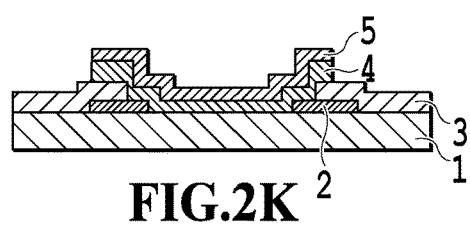
Figure 2G:
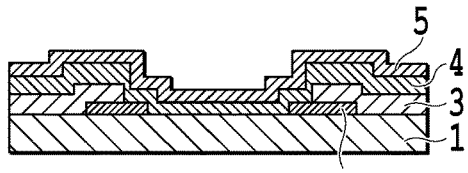

FIG. 2G shows a state in which a step of overall deposition of the bump base metal film 4 as the barrier metal and the gold 5 with predetermined thicknesses has been performed. The barrier metal is a metal film used to avoid diffusion or mutual reaction of metal material. Typically, for the bump base metal film 4, a metal that is highly adhesive to the gold 5 to be formed thereon is used. Furthermore, the gold 5 may be formed in a multi-layer structure. The barrier metal may be titanium tungsten, titanium nitride, tantalum, or tantalum nitride.

FIG. 2H shows a state in which a step of applying a second photoresist 9 by spin coating or the like onto the layer of the gold 5 has been performed.

FIG. 2I shows a state in which a step of exposing a resist pattern by using a second photomask 10 has been performed by a lithography technique. The second photomask 10 has a mask formed thereon, corresponding to the electrode pad portion 21.

FIG. 2J shows a state in which a step of developing the resist pattern as exposed in FIG. 2I has been performed.

FIG. 2K shows a state in which a step of etching the bump base metal film 4 and the gold 5 by using a mask of the second photoresist 9 and then a step of removing the second photoresist 9 have been performed. That is, first, a step of etching the bump base metal film 4 and the gold 5 is performed by using a mask having a mask pattern of the second photoresist 9 being formed in FIG. 2H and left in FIG. 2J. After that, a step of immersion in a stripping agent for the second photoresist 9 for a predetermined time to remove the second photoresist 9 is performed. As a result, the gold 5 is exposed.

Figure 2L:
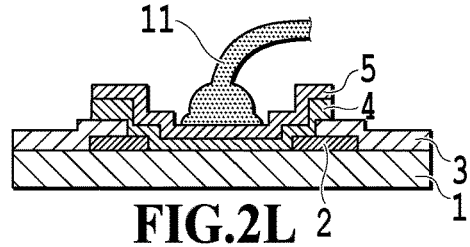

FIG. 2L shows a state in which a step of bonding of external connection wiring (external connection portion 11)

has been performed. Bonding of the external connection portion allows electric connection. The external connection portion 11 is preferably disposed in the center portion of the opening of the conductor layer 2. The purpose is to avoid metal diffusion of the gold into the conductor layer 2 caused by heat and pressure applied in bonding. FIG. 2L is a figure showing the same state as that of FIG. 1B.

After forming the gold bump 15 in the above described manner, a step of forming the nozzle resin material 18 as shown in FIG. 1A is performed. It should be noted that the gold bump 15 may be formed after the step of forming the nozzle resin material 18.

As described above, in the present embodiment, the opening region is provided on the portion of the conductor layer 2 (wiring) in the electrode pad portion 21, and the step of forming the gold bump having a gold thin film (a thickness of 1 µm or less) is performed. The external connection portion 11 is bonded to the upper layer portion in the laminating direction above the opening region. That is, since the conductor layer 2 is not formed in the lower layer portion in the laminating direction at a position to which the external connection portion 11 is bonded, it is possible to reduce metal diffusion of gold into the side of the conductor layer 2 caused by heat and pressure applied in bonding. Accordingly, it is possible to provide a liquid ejection head having a high connection reliability at low cost. Moreover, in a case of forming a nozzle made of a resin material after forming a gold bump, a nozzle can be processed with high precision.

Regarding the process for producing the gold bump 15 by patterning the conductor layer 2 in the electrode pad portion 21, a specific example will be described in detail with reference to FIGS. 2A to 2L.

FIG. 2A is a schematic cross-sectional view showing that aluminum copper (AlCu) serving as the conductor layer 2 is formed to have a thickness of 0.2 µm in the electrode pad portion 21.

FIG. 2B is a schematic cross-sectional view showing that the first photoresist 6 serving as a mask for a region of the conductor layer 2 not to be open is applied to an entire surface of a wafer, namely the semiconductor substrate 1, by spin coating or the like. For the first photoresist 6, a novolac-based positive photosensitive resist is used.

In FIG. 2C, the first photomask 7 is formed and a region of the conductor layer 2 to be open is exposed by using a photolithography process. An i-line stepper (FPA-5510iV available from Canon Inc.) is used for the exposure.

In FIG. 2D, the first photoresist 6 is developed. For a developer solution, an aqueous solution of tetramethylammonium hydroxide (TMAH) with a 3% concentration is used.

Figure 3:
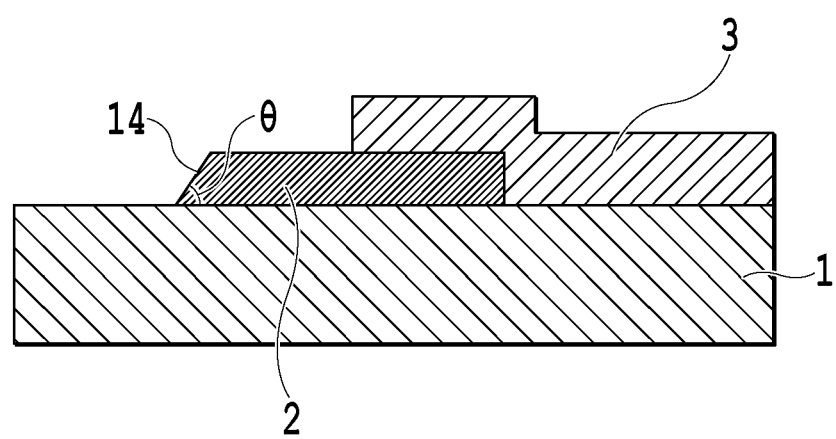
FIG. 3 is a view showing an example of a cross sectional angle of an opening of a conductor layer.

In FIG. 2E, wet etching is performed on the conductor layer 2. Using Pure ETCH-NS70 (available from Hayashi Pure Chemical Ind., Ltd.), a taper 14 of about 70° can be formed on the conductor layer 2 as shown in FIG. 3. As an alternative process, 10 minutes or longer may be set for a time for treatment with a solution of tetramethylammonium hydroxide (TMAH) with a 3% concentration in developing the resist shown in FIG. 2D, whereby the development of the resist and the etching of the conductor layer 2 can be performed at the same time. Since the bump base metal film (barrier metal) 4 and the gold 5 are formed in the subsequent steps, in consideration of the coverage of a step portion of the conductor layer 2, the step portion of the conductor layer 2 is preferably tapered. A cross sectional angle θ of the opening of the conductor layer 2 is preferably 30°<θ<90°.

In FIG. 2F, the first photoresist 6, after being used, is immersed in a dedicated removal agent for a predetermined time. For instance, the first photoresist 6 is immersed in a stripping agent including ethanolamine for about 30 minutes. As a result of the above steps, an opening is formed in a portion of the conductor layer 2. The opening has a size of 100 µm×100 µm.

In FIG. 2G, the bump base metal film 4 as the barrier metal and the gold 5 are deposited on an entire surface with predetermined thicknesses by a vacuum deposition apparatus or the like. For the bump base metal film 4 as the barrier metal, titanium tungsten (TiW), which is a metal material having a high melting point, is used. At this time, the step portion in the opening region of the conductor layer 2 can be favorably covered with titanium tungsten having a thickness of 0.2 µm. Furthermore, the gold film has a thickness of 0.4 µm.

In FIG. 2H, the second photoresist 9 serving as a mask in forming a gold bump is applied to the entire surface of the wafer by spin coating or the like. For the second photoresist 9, a novolac-based positive photosensitive resist is used.

In FIG. 2I, the second photomask 10 is used for exposure by using a photolithography process. The i-line stepper (FPA-5510iV available from Canon Inc.) is used for the exposure.

In FIG. 2J, development is performed and the second photoresist 9 is removed so as to mask the gold bump region (electrode pad portion 21) connected to the external connection portion 11 (external wiring). For a developer solution, an aqueous solution of tetramethylammonium hydroxide (TMAH) with a 3% concentration is used.

In FIG. 2K, using a mask of the second photoresist 9, a region of the gold 5 that is no longer needed is removed by immersion in a gold etchant including a nitrogen organic compound and iodine-potassium iodide for a predetermined time. Then, using masks of the patterned second photoresist 9 and the gold 5, a portion of the bump base metal film (barrier metal) 4 that is no longer needed is removed by immersion in a solution of hydrogen peroxide ($H_2O_2$) for a predetermined time. After that, the second photoresist 9, after being used, is immersed in a dedicated removal agent for a predetermined time, to expose the gold bump. As a result, the gold bump having a step shape formed in the electrode pad portion 21 is completed. As to the gold bump, by using electroplating, a plated bump may also be formed by applying a predetermined current to the conductor layer 2.

In FIG. 2L, bump connection is used to connect the external connection portion 11 to the gold bump 15 having a portion of the conductor layer 2 being open. This allows favorable electric connection while ensuring adhesion, without causing the gold to be diffused into the conductor layer due to the heat and pressure applied in bonding.

<Second Embodiment>

Before the steps described in the first embodiment, a step of testing characteristics of a semiconductor device (evaluation of electrical properties) in a semiconductor integrated circuit may be conducted by contacting the surface of the conductor layer 2 using a test probe. FIG. 1B as described in the first embodiment is a schematic view of the case where a bump is formed without the evaluation of electrical properties. In the present embodiment, an aspect of the case of conducting the evaluation of electrical properties will be described.

Figure 4A:
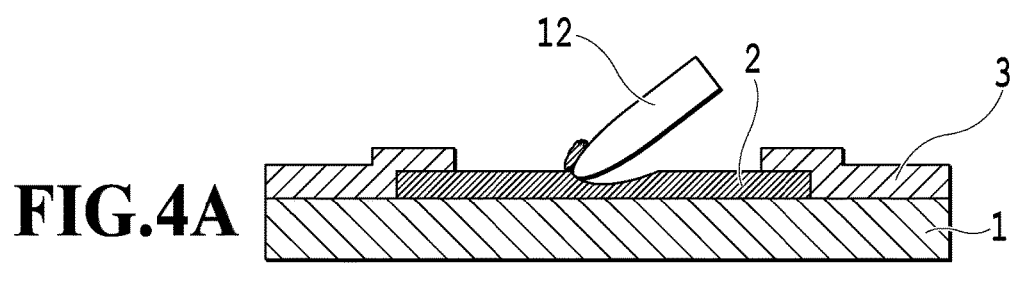
FIGS. 4A and 4B are views showing an example of a probe trace portion.
Figure 4B:
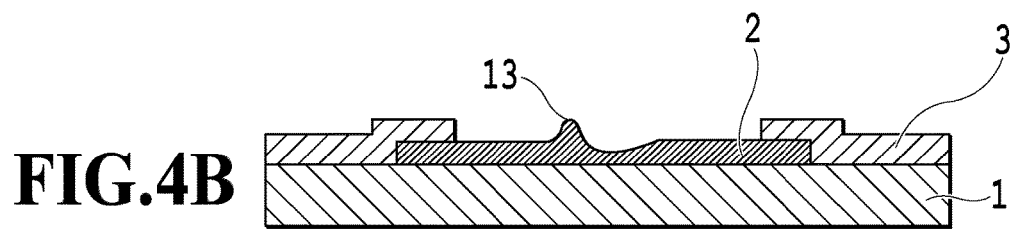

FIGS. 4A and 4B are views showing that the evaluation of electrical properties is being conducted. FIG. 4A shows a situation that a test probe 12 is scrubbed on the conductor layer 2 to conduct the evaluation of electrical properties. Typically, the test probe 12 is scrubbed on the conductor layer 2, whereby a probe trace portion 13 (concavo-convex shape) is formed on the surface of the conductor layer 2 as shown in FIG. 4B.

In this respect, in the present embodiment, after the evaluation of electrical properties is conducted, the steps described in the first embodiment are performed, that is, a region of the conductor layer 2 including the probe trace portion 13 becomes open. Typically, the probe trace portion 13 is formed in the center portion of the conductor layer 2 in the electrode pad portion 21. The center portion of the conductor layer 2 in the electrode pad portion 21 serves as a region having an opening therein through the steps described in the first embodiment. Accordingly, since the conductor layer 2 including the probe trace portion 13 is removed, a residue or the like produced by the test probe 12 can also be removed at the same time.

<Third Embodiment>

In the first embodiment, a description has been given of the aspect that the opening region of the conductor layer 2 is formed such that its opening area is smaller than the opening area of the through hole region (opening region) of the protective layer 3.

Figure 5:
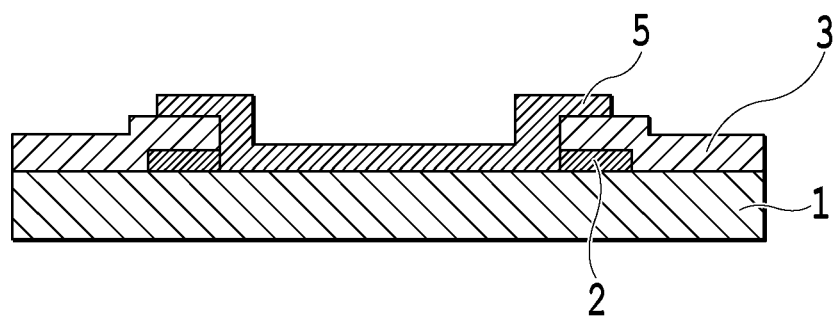
FIG. 5 is a view of a configuration not using a barrier metal.

In the present embodiment, as shown in FIG. 5, an opening area of an opening region of the conductor layer 2 is equal to an opening area of a through hole region of the protective layer 3. That is, instead of the first photomask 7 of FIG. 2C, a mask is formed such that an opening area of an opening region formed in the conductor layer 2 is equal to an opening area of an opening region of the protective layer 3. According to this configuration, a gold bump can be formed only by deposition of the gold 5, without providing the bump base metal film 4 as the barrier metal as shown in FIGS. 2A to 2L. That is, a layer of the gold 5 can be formed directly on the opening region in the laminating direction. It should be noted that even with a displacement due to manufacturing variations or the like, it is assumed that the same opening region is provided. Since the conductor layer 2 is not formed underneath the gold 5, and a contact surface between the gold 5 and the conductor layer 2 is minimized, it is possible to minimize metal diffusion of the gold 5 into the side of the conductor layer 2. Accordingly, it is possible to form an electrode pad not including a barrier metal with high reliability. Furthermore, since the bump base metal film 4 serving as the barrier metal, as described in the first embodiment, is not formed, it is possible to eliminate a step formed in forming the bump base metal film 4 and the layer of the gold 5 in the region having the external connection portion 11 disposed therein. Accordingly, the size of the through hole region of the protective layer 3 can be reduced, thereby also allowing connection by using the external connection portion 11 which is small in size.

It should be noted that although the example of forming the gold bump has been described in the above described embodiments, the present invention is not limited to such an example. A bump to be formed is not limited to a gold bump, and the present invention is applicable to the aspects using any kind of bump. For instance, the present invention is applicable to a bump (plated bump) such as Sn—Cu, Sn—Ag, and Sn—Ag—Cu or a copper (Cu) bump.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-054760, filed Mar. 21, 2017, which is hereby incorporated by reference wherein in its entirety.

What is claimed is:

1. A liquid ejection head substrate comprising an electrode pad for receiving driving power for liquid ejection from an outside, the electrode pad including at least a conductor layer and a layer of gold,
   wherein a portion of the conductor layer has an opening region,
   an upper layer portion in a laminating direction above the conductor layer including the opening region has at least the layer of gold, and
   an external connection portion connected to the outside is provided on top of the layer of gold corresponding to the opening region of the conductor layer.

2. The liquid ejection head substrate according to claim 1, wherein the layer of gold is formed with a thickness of 1.0 μm or less.

3. The liquid ejection head substrate according to claim 1, wherein the external connection portion is bonded to the top of the layer of gold corresponding to the opening region of the conductor layer.

4. The liquid ejection head substrate according to claim 1, wherein an opening area of the opening region is greater than an area of a region having the external connection portion provided therein.

5. The liquid ejection head substrate according to claim 1, wherein the opening region is formed in a lower layer portion in a laminating direction below a center portion of the region having the external connection portion provided therein.

6. The liquid ejection head substrate according to claim 1, wherein the opening region is formed in a region including a probe trace portion of the conductor layer.

7. The liquid ejection head substrate according to claim 1, wherein a barrier metal is formed between the conductor layer and the layer of gold.

8. The liquid ejection head substrate according to claim 7, wherein the barrier metal is titanium tungsten, titanium nitride, tantalum, or tantalum nitride.

9. The liquid ejection head substrate according to claim 1, wherein the opening area of the opening region is smaller than an opening area of a through hole of a protective layer protecting the conductor layer.

10. The liquid ejection head substrate according to claim 1, wherein a cross sectional angle of the opening region of the conductor layer is $30°<\theta<90°$.

11. The liquid ejection head substrate according to claim 1, wherein the opening area of the opening region is equal to the opening area of the through hole of the protective layer protecting the conductor layer.

12. The liquid ejection head substrate according to claim 11, wherein the layer of gold is formed directly on the opening region in the laminating direction.

13. A semiconductor substrate comprising an electrode pad for receiving power from an outside, the electrode pad including at least a conductor layer and a layer of gold,
   wherein a portion of the conductor layer has an opening region,
   an upper layer portion in a laminating direction above the conductor layer including the opening region has at least the layer of gold, and an external connection portion connected to the outside is provided on top of the layer of gold corresponding to the opening region of the conductor layer.

\* \* \* \* \*